(12) United States Patent  (10) Patent No.: US 6,519,271 B2
Kwon et al.  (45) Date of Patent: *Feb. 11, 2003

(54) PHOTONIC QUANTUM RING LASER DIODE

(75) Inventors: O'Dae Kwon, Kyungsangbuk-do (KR); Jung Chak Ahn, Kyungsangbuk-do (KR); Byung Hoon Park, Kyungsangbuk-do (KR)

(73) Assignee: Postech Foundation, Kyungsangbuk-do (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/172,278

(22) Filed: Oct. 14, 1998

(65) Prior Publication Data

US 2002/0024980 A1 Feb. 28, 2002

(30) Foreign Application Priority Data

Jan. 19, 1998 (KR) .............................................. 98-1387
Feb. 3, 1998 (KR) .............................................. 98-2973

(51) Int. Cl.[7] .................................................. H01S 5/00
(52) U.S. Cl. .......................................... 372/46; 372/96
(58) Field of Search ............................... 372/43–46, 50, 372/96

(56) References Cited

U.S. PATENT DOCUMENTS 5,343,490 A * 8/1994 McCall ........................ 372/43
5,345,462 A * 9/1994 Choquette .................... 372/45
5,363,393 A * 11/1994 Uomi et al. .................. 372/45
5,617,445 A * 4/1997 Jewell ......................... 372/96
5,679,964 A * 10/1997 Kobayashi et al. ........... 372/50
5,712,865 A * 1/1998 Chow et al. .................. 372/96
5,748,661 A * 5/1998 Kiely et al. .................. 372/50

OTHER PUBLICATIONS

Baba et al, "Lasing Characteristics of GaInAsP–InP Strained Quantum–Well Microdisk Injection Lasers with Diameter of 2–10 $\mu$m", IEEE Photonics Technology Letters, vol. 9, No. 7, Jul. 1997, pp. 878–880.*

* cited by examiner

Primary Examiner—Quyen Leung
(74) Attorney, Agent, or Firm—Bacon & Thomas

(57) ABSTRACT

A photonic quantum ring (PQR) laser diode with a plurality of laterally extending layers, one on top of another in an axial stack, comprises an active region sandwiched between an n type multi-layer distributed Bragg reflector (DBR) stack and a p type multi-layer DBR stack, wherein, along the circumference of said active region, 3 dimensional radiations are emitted with various wavelengths over a predetermined tuning range, as a function of slanted view angle with respect to the stack axis. The PQR laser shows an ultra-low threshold current of $\mu$A range, $T^{1/2}$ dependence of the spectral peak shift and a square law behavior of threshold currents.

8 Claims, 9 Drawing Sheets

PHOTONIC QUANTUM RING LASER DIODE

FIELD OF THE INVENTION

The present invention relates to a semiconductor laser; and, more particularly, to a 3 dimensional whispering gallery (WG) photonic quantum ring (PQR) laser diode with an ultra-low threshold current.

DESCRIPTION OF THE PRIOR ART

In general, a surface emitting laser can be classified into either a vertical cavity surface emitting laser(VCSEL) or a concentric circular grating surface emitting laser(CCGSEL), wherein the VCSEL comprises a semiconductor substrate, e.g., n type gallium arsenide, and a VCSEL diode integrated thereon. The VCSEL diode includes a plurality of laterally extending horizontal layers, being arranged one on top of another, in a vertical axial stack including an active cavity region sandwiched between an n type multiple-layer distributed Bragg reflector (DBR) mirror stack and a p type multi-layer DBR mirror stack.

The active cavity region contains a plurality of hole electron pairs forming dipoles along a laterally horizontally extending quantum well. The holes and electrons recombine to emit photons in a process called spontaneous emission. Such photons are emitted in all directions. Numerous reflected trips of such photons back and forth between the DBR mirror stacks ensure to induce stimulated and amplified axial emission, thereby generating an emission of stimulated and amplified axial lasing mode, i.e., VCSEL mode.

A drawback of the VCSEL is that a relatively large injection current is required to reach a lasing threshold. Therefore, the high mean thermal density of the VCSEL has restricted applications. e.g., high density array, optical interconnects and signal processing. Since, further, the wavelength $\lambda_{VCSEL}$ in the VCSEL mode increases linearly with temperature, the temperature of the active cavity region of the VCSEL must be maintained with negligible variations.

SUMMARY OF THE INVENTION

It is, therefore, a primary object of the invention to provide a photonic quantum ring laser diode with an ultra-low threshold current approaching a $\mu$A range.

In accordance with the present invention, there is provided a photonic quantum ring (PQR) laser diode with a plurality of laterally extending layers, one on top of another in the stack axis, comprising:

an active region sandwiched between an n type multi-layer distributed Bragg reflector (DBR) stack and a p type multi-layer DBR stack, wherein, along the circumference of the active region, 3 dimensional PQR radiations are emitted with various wavelengths as a function of slanted view angle with respect to the stack axis;

a covering region for surrounding the active region and for transmitting the three dimensional PQR radiations therethrough, radiation therethrough, whereby said radiation is confined by wherein the refractive index of the active region is larger than that of the covering region so that the 3 dimensional PQR radiations are confined by a 3 dimensional toroidal Rayleigh's cavity effectively formed along the circumferential portion of the active region; and fully-connected ring-shaped top electrode in the case of the conventional VCSEL, which make the three dimensional PQR radiations from the active region become visible and detectable.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1A:
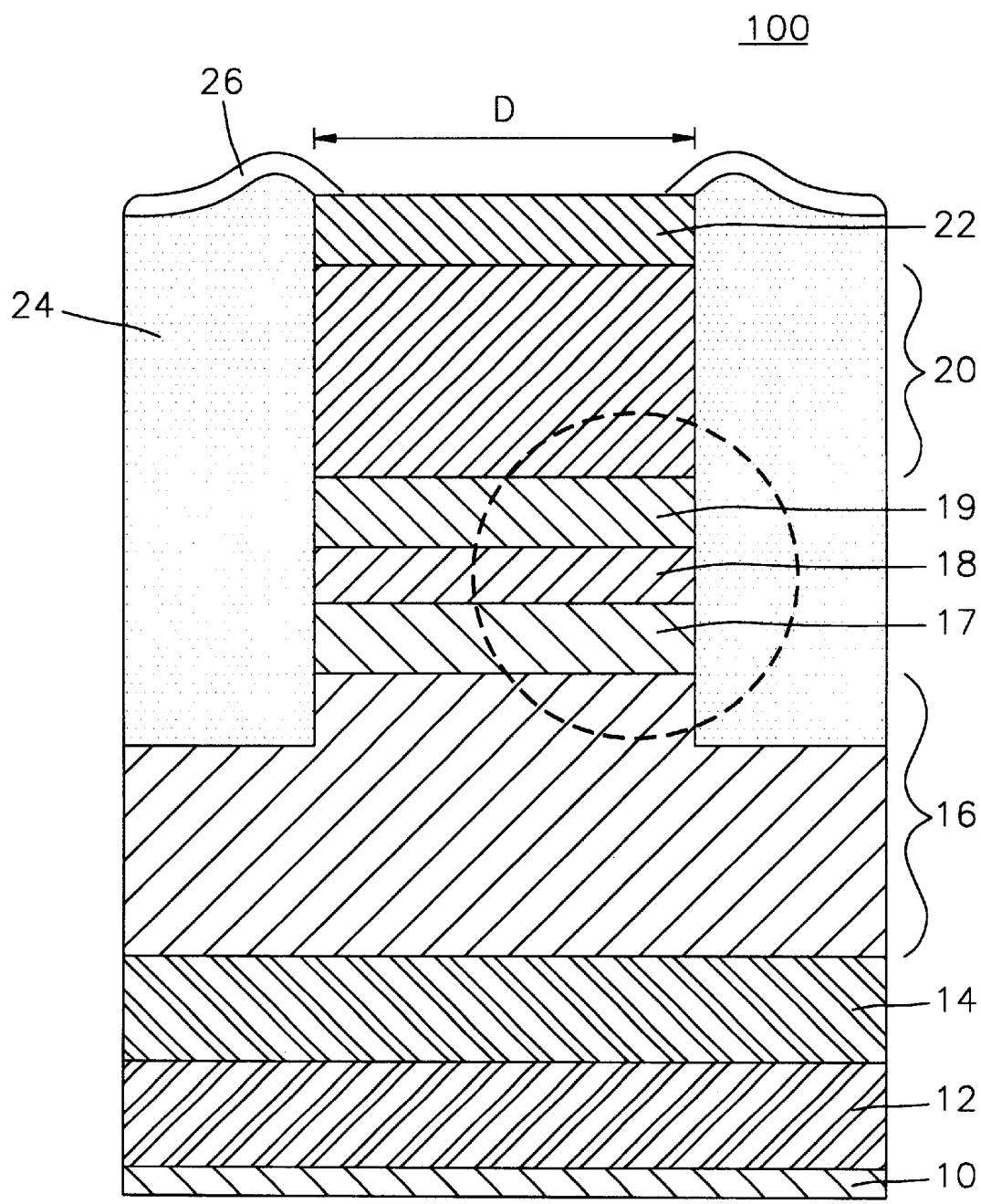
FIGS. 1A and 1B represent a cross-sectional view and a partially enlarged view thereof of a three dimensional (3D) whispering gallery (WG) photonic quantum ring (PQR) laser diode in accordance with the present invention.
Figure 1B:
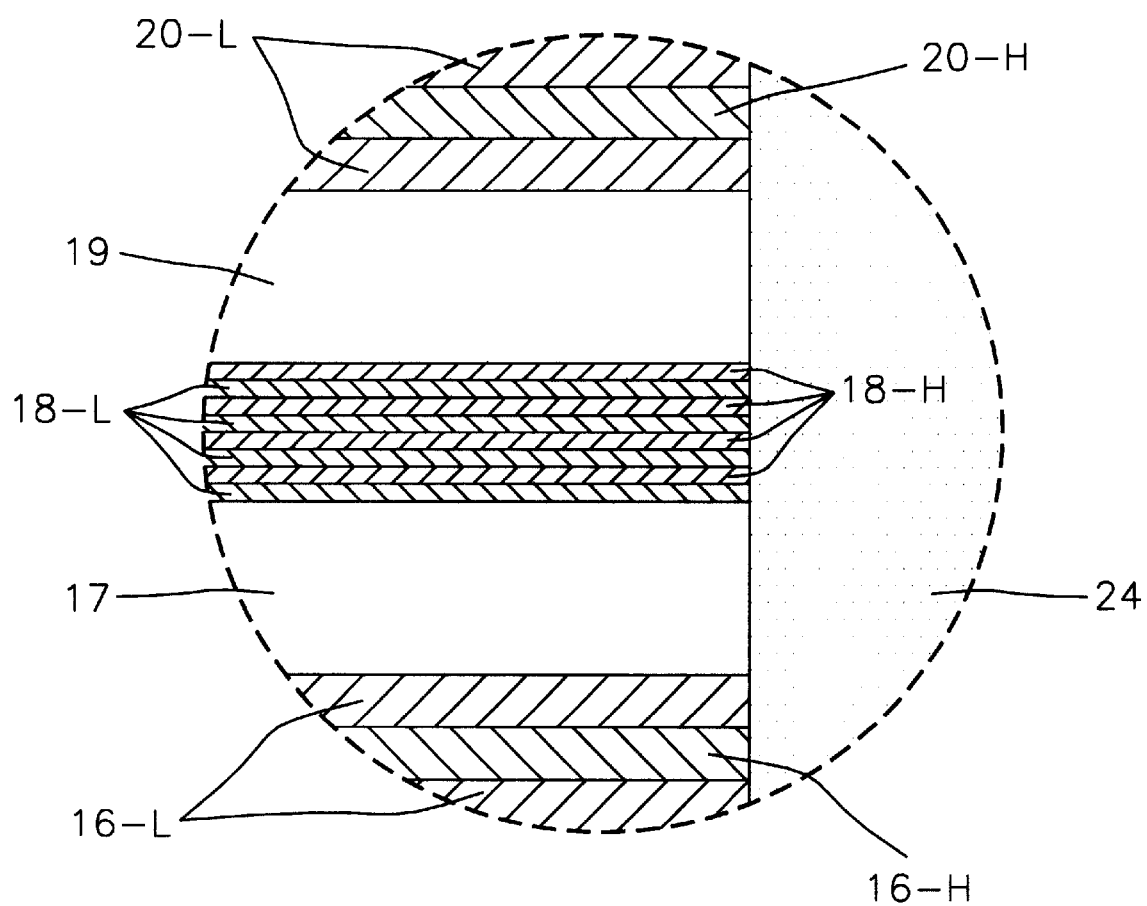

Referring to FIGS. 1A and 1B, there are illustrated a three dimensional whispering gallery (WG) photonic quantum ring (PQR) laser by using a circular vertical-cavity surface-emitting laser (VCSEL). It should be understood that while there is illustrated only a single 3D WG PQR laser in FIGS. 1A and 1B, many 3D WG PQR lasers may be located on a substrate to form arrays.

The 3D PQR laser is produced by employing the steps of epitaxially depositing an active region 18 with a plurality of quantum wells, e.g., four quantum wells, sandwiched between an n-type distributed Bragg reflector (DBR) 16 and a p-type DBR 20 on a substrate 12; generating a cylindrical mesa by using a dry etching; surrounding the cylindrical mesa by a polyimide planarization; and padding striped or multiply-segmented p electrodes 26 on top of the cylindrical mesa and one n electrode 10 under the substrate 12.

Specifically, the substrate 12 is made of any suitable material, e.g., gallium arsenide (GaAs), Indium Phosphide (InP), or the like and is typically n+ doped so as to facilitate epitaxial growth of subsequent multiple layers.

Typically, any suitable epitaxial deposition method, e.g., molecular beam epitaxy (MBE), metal organic chemical vapor deposition (MOCVD) or the like, is used to make the required multiple layers. These methods allow for the epitaxial deposition of material layers, e.g., aluminum arsenide, gallium arsenide, aluminum gallium arsenide, and the like. It should be understood that epitaxial deposition is used extensively to produce the multitude of layers.

After an n+ GaAs buffer layer 14 with thickness of 0.3 $\mu$m is deposited on the n+ GaAs substrate 12, many layers with two different indices of refraction are stacked one on top of another to form the n-type DBR 16. That is to say that 41 lower layers 16-L of $Al_xGa_{1-x}As$ and 40 higher layers 16-H of $Al_yGa_{1-y}As$ are deposited alternately to form the n-type DBR 16 as shown in FIG. 1B, wherein $0 \leq x$ and $y \leq 1$, x and y being preferably 0.9 and 0.3, respectively. $Al_xGa_{1-x}As$ has preferably a relative low index of refraction and $Al_yGa_{1-y}As$ has preferably a relative high index of refraction so that the lower layer 16-L with a relative low index of refraction may be adjacent to the active region 18. Each layer of the n-type DBR 16 is a quarter-wavelength $\lambda_n/4$ thick, wherein the wavelength $\lambda_n=\lambda/n$ is a wavelength in its layer of the laser radiation emitted in a VCSEL mode, λ being the free space wavelength of the laser radiation and n being the refractive index for $Al_xGa_{1-x}As$ or $Al_yGa_{1-y}As$.

The active region 18 sandwiched between a lower and an upper AlGaAs spacers 17 and 19, each of the lower and the upper AlGaAs spacers 17 and 19 being 850 Å thick, is deposited on the n-type DBR 16, wherein the active region 18 is made of 4 sets of alternating layers of $Al_zGa_{1-z}As$ 18-L with a smaller bandgap energy and $Al_xGa_{1-x}As$ 18-H with a larger bandgap energy, z and x being preferably 0.11 and 0.3, respectively so that 4 quantum wells made of $Al_zGa_{1-z}As$ 18-L are generated in the active region 18 as shown in FIG. 1B. Each layer of $Al_zGa_{1-z}As$ 18-L and $Al_xGa_{1-x}As$ 18-H is preferably 80 Å thick. It should be noted that the total vertical dimension of the two AlGaAs spacers 17 and 19 and the active region 18 is one-wavelength-thickness of the radiation of the VCSEL mode and the vertical dimension of each of the two AlGaAs spacers 17 and 19 and the active region 18 depends on its index of refraction. On the upper spacer 19, many layers with two different indices of refraction are stacked one on top of another so that a p-type DBR 20 with substantially higher reflectivity is formed. That is to say that 30 lower layers 20-L of $Al_xGa_{1-x}As$ and 30 higher layers 20-H of $Al_yGa_{1-y}As$ are deposited alternately to form the p-type DBR 20 as shown in FIG. 1B, wherein x and y are preferably 0.9 and 0.3, respectively. Each layer of the p-type DBR 20 is preferable to be a quarter-wavelength $\lambda_n/4$ thick. On the P-type DBR 20, p+ GaAs cap layer 22 is deposited.

After the above epitaxial deposition, the sidewalls of the active region 18 and the two spacers 17 and 19 are etched by using a dry etching, e.g., the chemically assisted ion beam etching (CAIBE), so that a smooth cylindrical mesa is generated. It is noted that the surface etched by the CAIBE is more uniform than that etched by any other etching method, e.g., the reactive ion etching (RIE). The diameter of the cylindrical mesa can vary from a sub-μm to scores of μm's.

The etched cylindrical mesa is surrounded by a polyimide channel 24 by a polyimide planarization technique. The polyimide channel 24 supports striped or multiply-segmented p electrodes 26 as described below and provides a path to transmit the radiations of the PQR mode generated in the toroidal cavity.

The n electrode 10 of AuGe/Ni/Au is deposited under the n+ substrate 12 and the striped or multiply-segmented p electrodes 26 are deposited on the p+ GaAs cap layer 22, wherein the striped or multiply-segmented p electrodes 26 are made of Cr metal layer with a thickness of 200 Å and Au metal layer with a thickness of 2000 Å. The metallic n and p electrodes 10 and 26 are ohmic-contacted with the semiconductor, i.e., the GaAs substrate 12 and the p+GaAs cap layer 22, respectively, by a rapid thermal annealing process in 30 seconds at 425° C.

Figure 2:
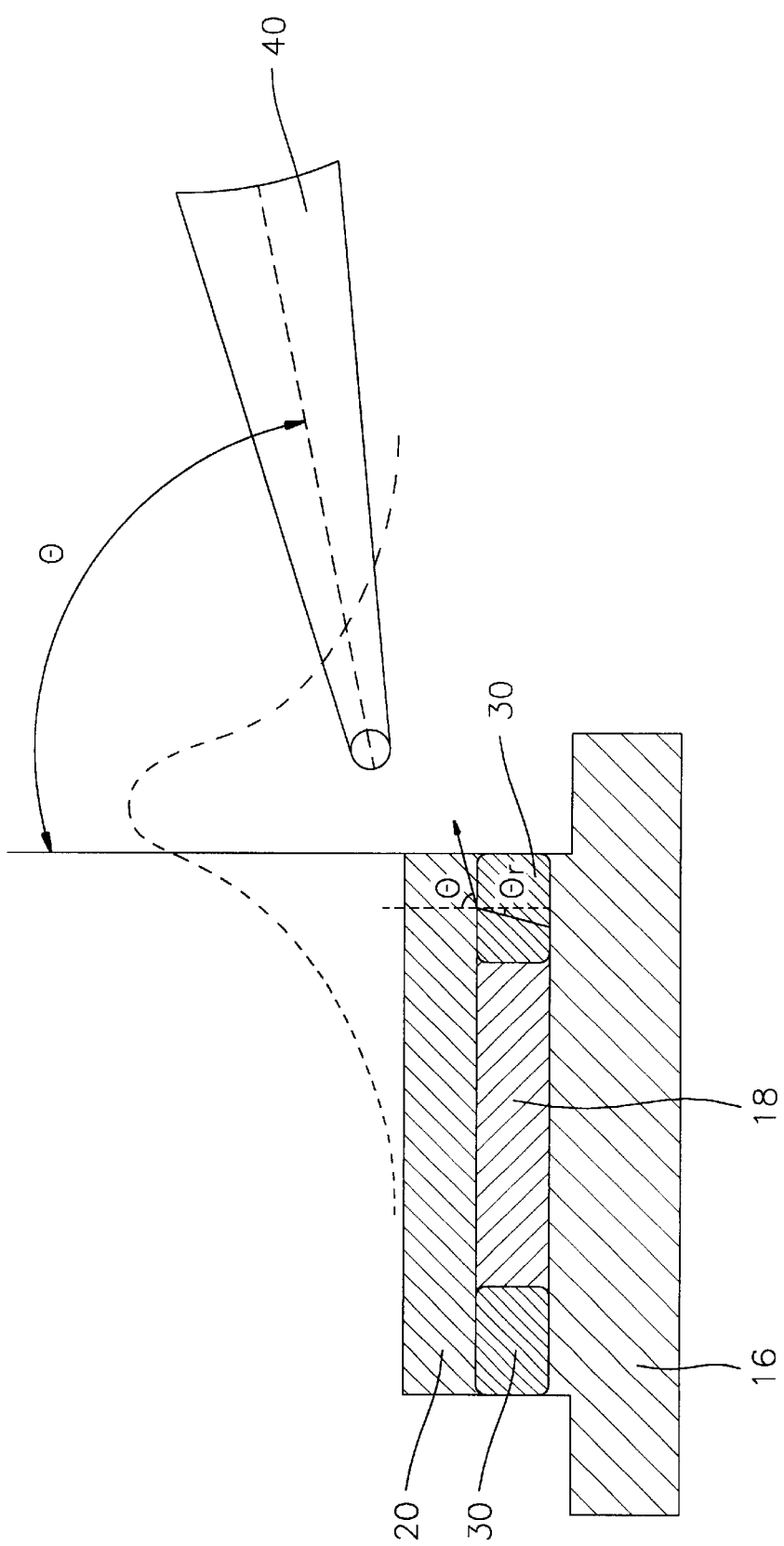
FIG. 2 shows a schematic diagram of an effective toroidal cavity formed by n-type and p-type DBRs, together with the in-plane annular Rayleigh confinement.

Referring to FIG. 2, there is shown a schematic diagram of an effective toroidal cavity 30 formed along the circumference of the active region 18. Specifically, the n-type and the p-type DBRs 16 and 20 vertically confine photons generated from the active region 18, in addition to the in-plane annular Rayleigh confinement by the large difference of the refractive index between the active region 18 and the covering region 24 at the outer boundary and by inner-reflection point at the inner boundary. Thus a one-k thick toroidal 3D cavity 30 of the PQR mode is naturally created so that helical intra-cavity mode WG propagation along the azimuthal axis may be allowed. The 3D WG mode, which travels helically in the toroidal cavity 30, will give rise to clockwise and counterclockwise traveling waves, which are then vector-summed to the radial emission, different from the tangential p propagation of the usual 2D WG mode (see, S. L. McCall et al. "Whispering gallery mode microdisk lasers", Appl. Phys. Lett., 60(3), pp. 289–291, 1992; and Toshihiko BaBa et al. "Lasing Characteristics of GaInAsP—InP Strained Quantum-Well Microdisk Injection Lasers with Diameter of 2–10 μm" IEEE Photon. Tech. Lett., 9(7), pp. 878–880, 1997). The radial emission from such a toroidal cavity becomes an evanescent wave and can be visible through the striped or multiply-segmented p electrodes gap opening residing on the circumferential PQR regions. The evanescent emission of 3D PQR mode is detected by using a tapered single mode fiber tip 40 whose outer-tip-diameter is around 5 μm, and its intensity profile is also plotted in dotted line in FIG. 2, where its intensity maximum is at some distance (t) away from the edge of the toroidal cavity, e.g., t=5 μm for ψ=48 μm and t=1 μm for ψ=15 μm.

Figure 3A:
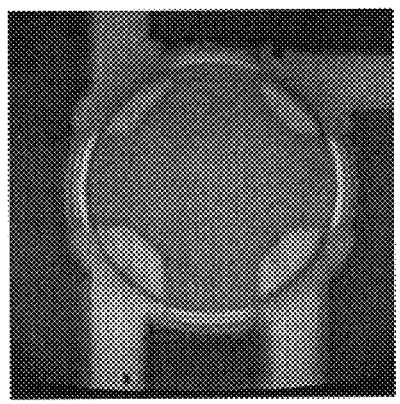
FIGS. 3A to 3C illustrate three near-field micrographs for three injection currents, respectively, of a 3D WG PQR laser diode of 48 $\mu$m diameter with 4 segmented top electrodes.
Figure 3B:
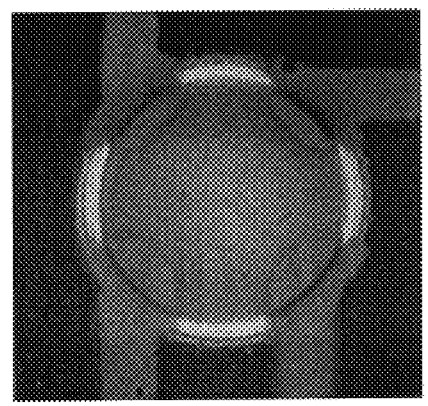
Figure 3C:
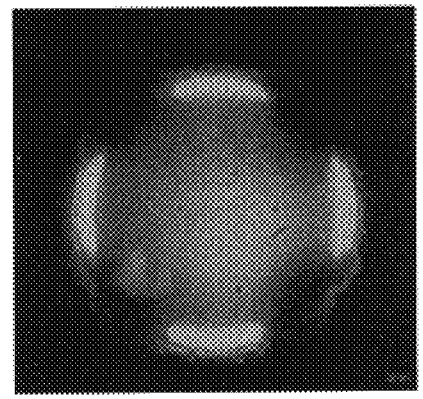

Referring to FIGS. 3A to 3C, there are shown three near-field micrographs for three currents, respectively, of a 3D WG PQR laser diode of 48 μm diameter with 4 segmented top electrodes. FIG. 3A represents the "carrier crowded" gain ring at an injection current I=16 μA, taken at the onset of vague spontaneous emission generated right after the transparency condition. FIG. 3B shows a lasing emission near the lasing threshold current $I_{th}$=48 μA, wherein the lasing is indicated by the arrow-like glows appearing suddenly and covering over the edges of electrode shadow. FIG. 3C corresponds to the case of 1 mA current injection, which is a properly attenuated image of the PQR laser well overpowering the central region of VCSEL's spontaneous emission.

Figure 4A:
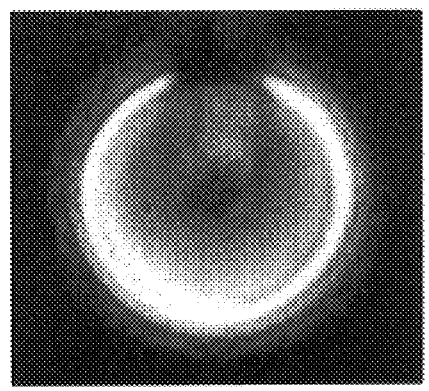
FIGS. 4A to 4C provide the near-field micrographs for three currents of a 3D WG PQR laser diode of 15 $\mu$m diameter with one stripe top electrode.
Figure 4B:
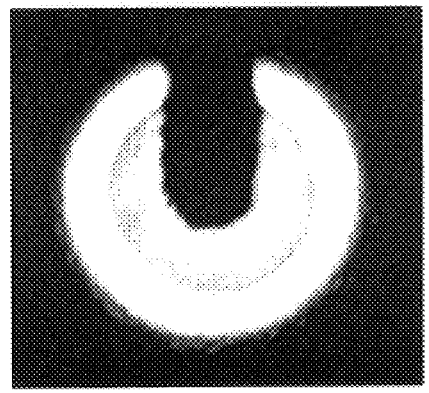
Figure 4C:
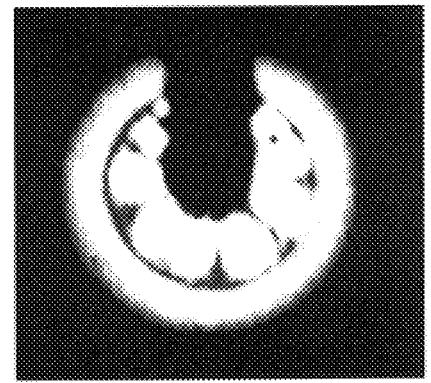

Referring to FIGS. 4A to 4C, there are illustrated three near-field micrographs for three currents, respectively, of a 3D WG PQR laser diode of 15 μm diameter with one striped top electrode. FIG. 4A shows an annular PQR lasing emission near the lasing threshold current $I_{th}$=12 μA of the PQR mode. FIG. 4B corresponds to the case of 11.5 mA current injection, just below the VCSEL threshold, wherein the ring-shape emission pattern and spectra behaviors remain mostly unchanged. As the injection current increases above the VCSEL threshold current $I_{th,VCSEL}$=12 mA, FIG. 4C shows that the emission of intra-VCSEL-cavity high order transverse mode begins with 10-fold rotational symmetry simultaneously with already-present PQR modes. It is noted that, after the VCSEL threshold current, the mode energies in the toroidal cavity are divided into intra-cavity VCSEL mode and extra-cavity PQR mode.

Figure 5:
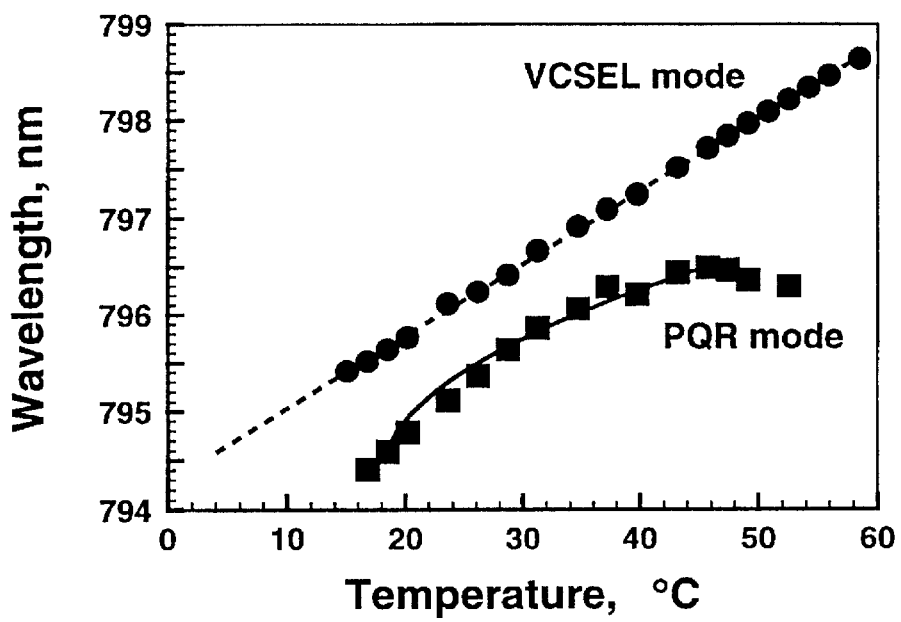
FIG. 5 offers a graph for illustrating a temperature dependence of the spectral peak shift in the PQR mode.

Referring to FIG. 5, there is shown a graph for illustrating a temperature dependence of the spectral peak shift in the PQR mode, comparing with that of the spectral shift in the VCSEL mode. It is noted that the wavelength PQR in the PQR mode shows a distinct $T^{1/2}$ dependence, while the wavelength $\lambda_{VCSEL}$ in the VCSEL mode increases linearly with a temperature coefficient of 0.07 nm/° C. The best fit to each of the curves in FIG. 5 is respectively given as follows:

$\lambda_{PQR} = 0.42\sqrt{T-18} + 794.3 \text{[nm]}$ $\lambda_{VCSEL} = 0.07T + 794.3 \text{[nm]}$ Linear T dependence is shown for both the index-dominated spectral change for short resonant cavities like the VCSEL and the gain-dominated spectral change for long cavities like the edge-emitting diode(see, G. W. Taylor et al., "Temperature dependent operation of the vertical cavity surface emitting laser", IEEE J. Quantum Electron. QE-30, pp. 2262–2271, 1994). The above measured temperature coefficient of 0.07 nm/° C. for intracavity VCSEL mode is consistent with the index-dominated mechanism. On the other hand, the 3D Rayleigh toroid for the PQR emission is to be classified as a long cavity confining the helical wave propagation along the circumference of the active disk, and hence the PQR emission ought to be gain-dominated. Indeed, the observed spectral $T^{1/2}$-dependence implies the gain-induced lasing, and is best explained by the quantum wire assumption, i.e., $T^{1/2}$-dependent transparency condition (see, A. Yariv, "Scaling laws and minimum threshold currents for quantum-confined semiconductor laser", Appl. Phys. Lett., Vol. 53, pp. 1033–1035, 1988), despite the fact that the active region is made of the quantum wells.

We also note that the wavelength of the PQR mode shifts level off in the region of T≧40° C., which may solve the nagging problem of the spectral wandering due to local device heating associated with typical high-density laser arrays.

Figure 6:
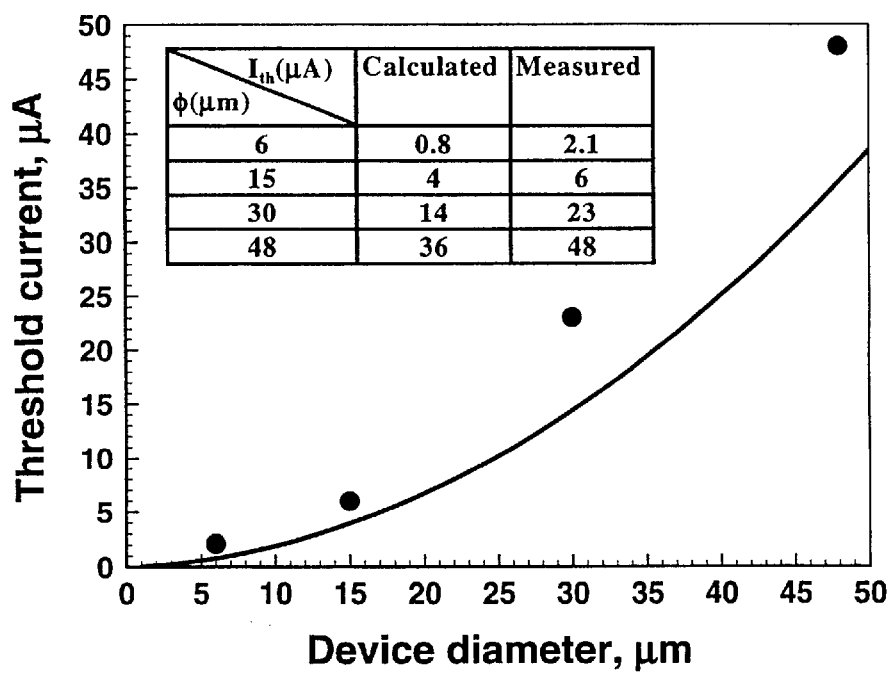
FIG. 6 depicts a graph for illustrating a size dependence of the threshold currents in the PQR mode.

Referring to FIG. 6, there is depicted a graph for illustrating a size dependence of the threshold currents in the PQR mode, wherein the threshold current $I_{th}$ indicates a square law dependency on the diameter of the PQR laser diode, i.e., $I_{th} \phi^2$.

In estimating the threshold currents of the PQR emission, the toroidal cavity can be seen as a concentric array of PQRs whose characteristic unit length is defined by half the wavelength ($\lambda_{PQR}/2$), thereby reflecting the nature of paraxial lightwave bundle characterized by the transverse peaks with a half-cycle interval.

For a quasi-quantum wire, the transparency carrier density $N_{tr}$ is described as follows (see, A. Yariv)

$$N_{tr} = 1.072 \frac{\sqrt{2m_c k_B (T+273)}}{\pi \hbar} \simeq 1.5 \times 10^6 \text{ cm}^{-1}$$

wherein $m_c$ is the effective mass of a carrier, i.e., an electron, $\hbar(=1.504 \times 10^{-34} \text{ Js})$ is the Planck's constant, $k_B(=1.38054 \times 10^{-23} \text{ J/K})$ is the Boltzman's constant, T represents temperature (° C.) of the active region.

Accordingly, the transparent current $I_{tr}^{PQR}$ for a single quasi-quantum wire is described as follows:

$$I_{tr}^{PQR} = N_{tr} \pi \phi \frac{e}{\tau}$$

wherein $\phi$ is a diameter of the quasi-quantum ring, $e(=1.6 \times 10^{-19} \text{ C})$ is an electron charge and $\tau(=3 \text{ ns})$ is the mean life time of the carrier. In case the diameter $\phi$ is 48 $\mu$m, the transparent current $I_{tr}^{PQR}$ is estimated as 1.2 $\mu$A.

In the meantime, the Rayleigh WG band width $W_{Rayleigh}$ is described as follows(see, M. K. Chin et al., "Estimation of the spontaneous emission factor for microdisk lasers via approximation of whispering gallery modes", J. Appl. Phys., Vol. 75, pp. 3302–3307, 1994):

$$W_{Rayleigh} \simeq \frac{\phi}{2}\left(1 - \frac{n_{eff}}{n}\right)$$

wherein $n_{eff}(=3.28)$ is the effective refractive index and $n(=3.5)$ is the refractive index of the active region. If the diameter is 48 $\mu$m, the Rayleigh WG band width $W_{Rayleigh}$ is approximated as 1.5 $\mu$m.

Since the toroid cavity is regarded as a concentric assembly of quasi-quantum wires with the toroidal width $W_{Rayleigh}$, each quasi-quantum wire can be defined as a photonic quantum ring (PQR). If a width of a PQR is assumed to be half a wavelength $\lambda_{PQR}$ of the PQR mode in the active region, the number of PQRs is calculated as follows:

$$\chi = \frac{W_{Rayleigh}}{\frac{\lambda_{PQR}}{2n_{eff}}}$$

That is to say that the toroidal cavity with the diameter $\phi(=48 \mu m)$ corresponds to an assembly of 13 PQRs. The transparency current $I_{tr}^{toroid}$ of the 3D WG PQR laser diode is then described as follows:

$$I_{tr}^{Rayleigh} = \chi I_{tr}^{PQR} = 2n_{eff} \frac{W_{Rayleigh}}{\lambda_{PQR}} N_{tr} \pi \phi \frac{e}{\tau} = \frac{\pi n_{eff} N_{tr}}{\lambda_{PQR}}\left(1 - \frac{n_{eff}}{n}\right)\frac{e}{\tau}\phi^2$$

In the meantime, the threshold current of the 3D WG PQR laser is described as follows:

$$I_{th} = I_{tr}^{Rayleigh} + I_{scatt} + I_{mirror}$$

The scattering current $I_{scatt}$ by the scattering loss constant $\alpha_{scatt}$ is calculated as follows:

$$I_{scatt} = \alpha_{scatt} \times \frac{V_{toroid}}{g'_{1D}} \times \frac{e}{\tau} \simeq 17 \text{ μA}$$

wherein the volume $V_{toroid}$ of the toroidal cavity is $W_{toroid} \times \pi \phi \times d$ with the diameter $\phi$ of the quasi-quantum ring, a thickness $d(=A\lambda_0/n)$ of the active region, the wavelength $\lambda_0(=0.795 \mu m)$ of the VCSEL mode, the differential gain coefficient $g'_{1D}(=8 \times 10^{-16} \text{ cm}^2)$ and the scattering loss constant $\alpha_{scatt}(=5 \text{ cm}^{-1})$ The diameter $\phi$ with 48 $\mu$m corresponds to the scattering current $I_{scatt}$ with 17 $\mu$A.

In the meantime, the mirror current $I_{mirror}$ by the reflectivity of the lower and the upper DBRs is calculated as follows:

$$I_{mirror} = \frac{d}{2g'_{1D}}\left(1 - \frac{n_{eff}}{n}\right)(\ln R^{-1})\frac{e}{\tau}\phi$$

wherein R is reflectivity of the lower and the upper DBRs.

Accordingly, the theoretical threshold current $I_{th}$ of the PQR laser is calculated as follows:

$$I_{th} = A\phi^2 + B\phi \text{ with}$$

$$A = \pi\left(\frac{n_{eff} N_{tr}}{\lambda_{PQR}} + \frac{\alpha_{scatt} d}{2g'_{1D}}\right)\left(1 - \frac{n_{eff}}{n}\right)\frac{e}{\tau}$$

-continued $$B = \frac{d}{2g'_{1D}}\left(1 - \frac{n_{eff}}{n}\right)(\ln R^{-1})\frac{e}{\tau}$$

The theoretical threshold current $I_{th}$ calculated based on the PQR concept indicates a square law dependency on the diameter of the PQR laser diode, i.e., $I_{th} \phi^2$, excluding the relatively small contribution from the mirror loss of the upper and the lower DBRs.

A comparison between experiment and theory of the threshold current $I_{th}$ is shown in FIG. 6, and it indeed suggests an excellent agreement therebetween except some systematic discrepancies presumably due to substantial scattering losses associated with microscopically rough peripheral structures. As the diameter of the PQR laser diode decreases, the Rayleigh bandwidth $W_{Rayleigh}$ also decreases, and in turn the scattering loss due to the peripheral surface roughness is now more serious and thus becomes the dominant loss factor.

Figure 7:
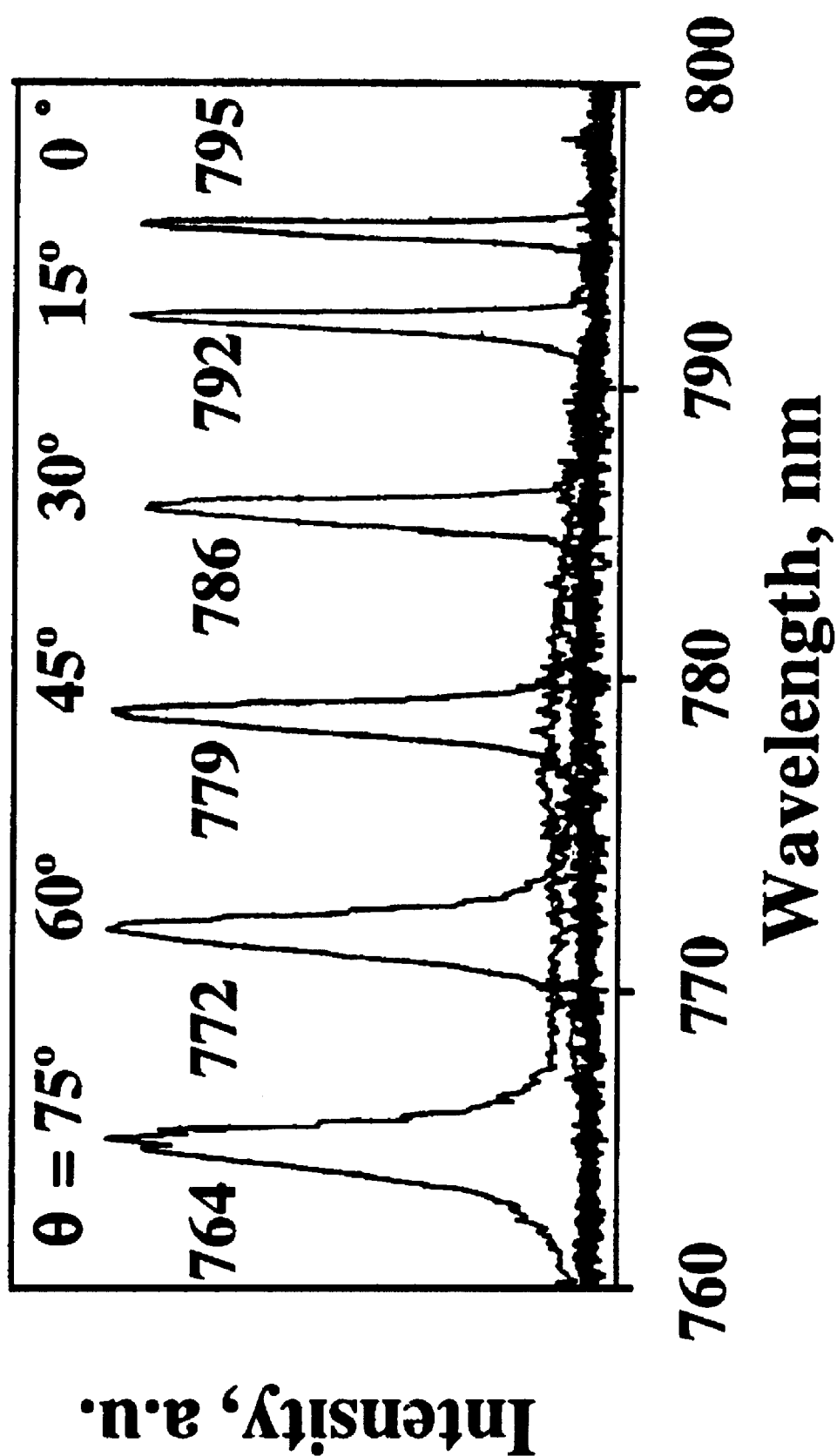
FIG. 7 presents an emission spectrum for illustrating an angle dependence of the radiation wavelength in the 3D WG PQR laser.

Referring to FIG. 7, there is presented an emission spectrum as a function of the radiation wavelength in the 3D PQR laser with a diameter $\phi(=48 \mu m)$ for various $\theta$ angles, wherein the injection current I(=10 mA) is below the threshold current $I_{th}^{VCSEL}(=12$ mA) of the VCSEL mode. The slanted view angle $\theta$ is an angle between the probing fiber 40 and the vertical axis of the toroidal 3D cavity as shown in FIG. 2. The spectra exhibit continuous blue shifts from 795 nm to 764 nm as the view angle $\theta$ increases from 0° to 75°.

These blue shifts are found to be associated with the off-normal Fabry-Perot conditions originating from the tilted propagation inside the cavity. The emission wavelength $\lambda_e$ in accordance with the Fabry-Perot resonance conditions is given as follows:

$$\lambda_e = \lambda_0 \cos\theta_r = \lambda_0 \sqrt{1 - \left(\frac{\sin\theta}{n}\right)^2}$$

wherein the refraction angle $\theta$ is defined by Snell's law. The angle-dependent blue shifts are relatively independent of the diameter of the PQR laser diode.

Figure 8:
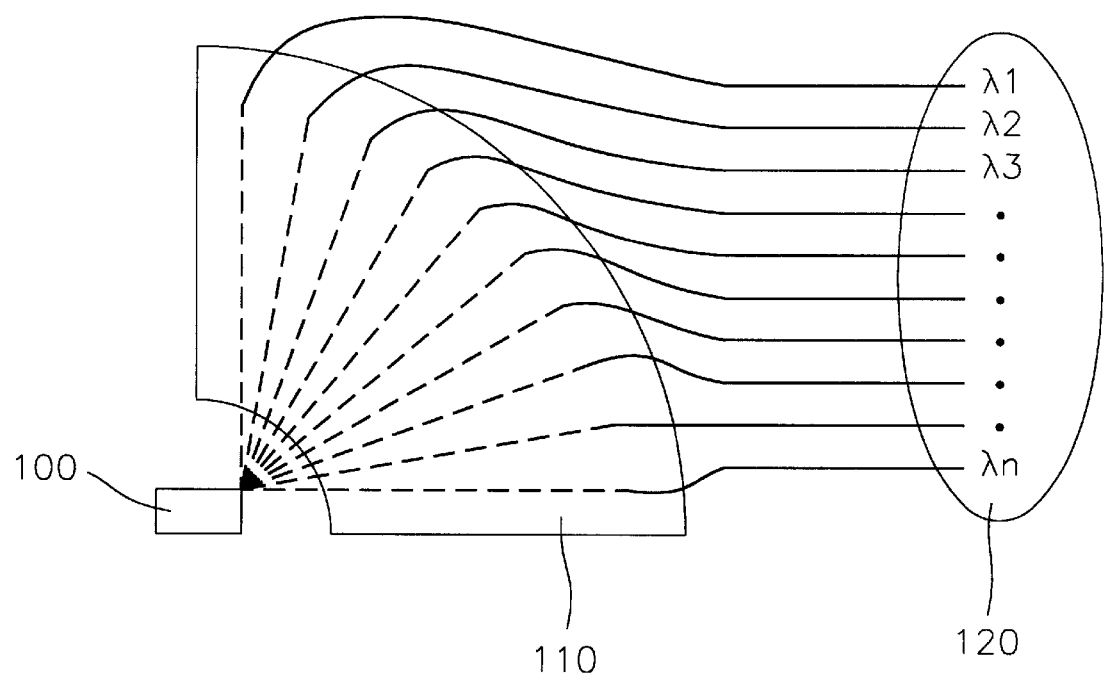
FIG. 8 displays a wavelength division multiplexing (WDM) application by using a PQR laser.

Referring to FIG. 8, there is illustrated a wavelength division multiplexing (WDM) application including a PQR laser 100, a wave guide 110 and a fiber array bundle 120, wherein the PQR laser can be a good alternative to wavelength division multiplexing (WDM) source, based on the angle-dependent multi-wavelength emission characteristics, while the conventional WDM source has been formed as an array of individual lasers since each laser emits different wavelength from each other.

Figure 9:
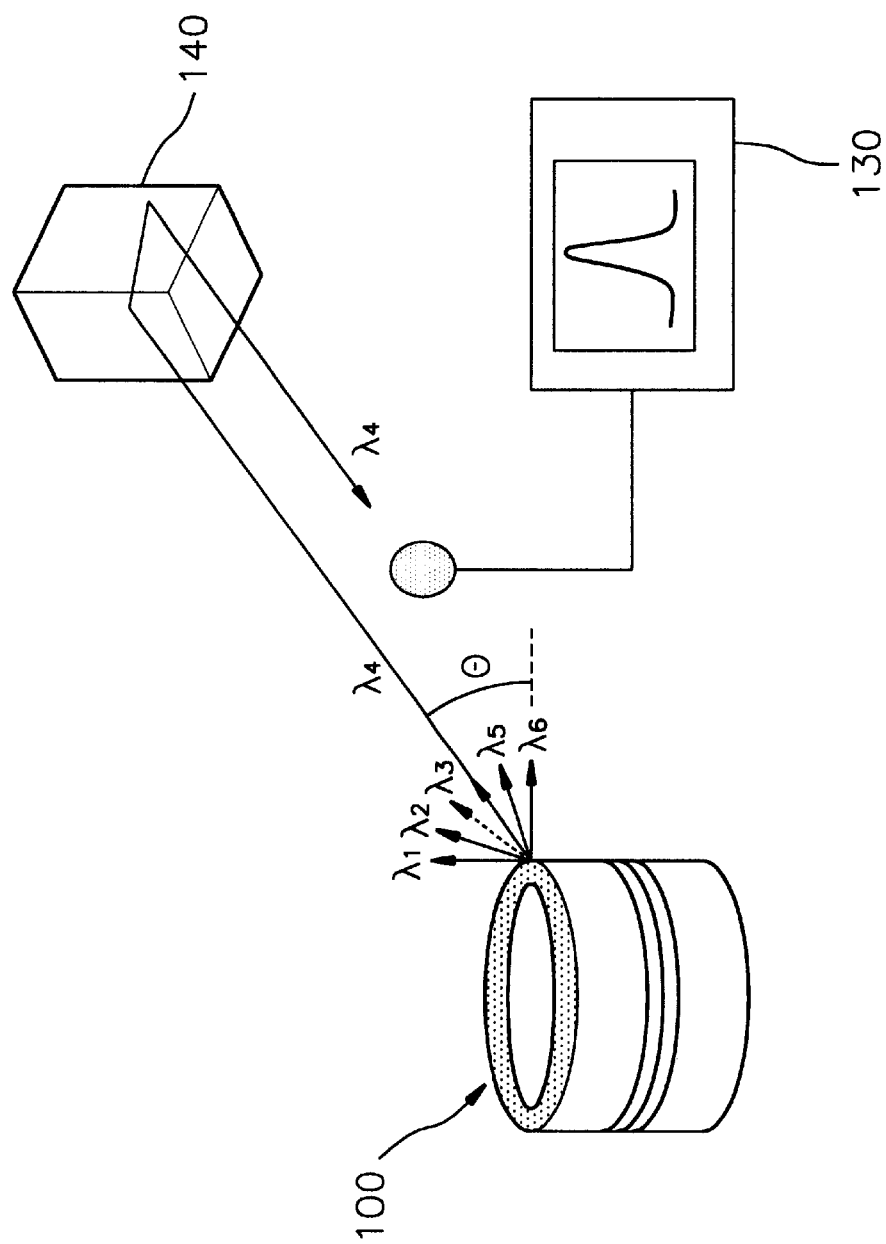
FIG. 9 illustrates an optical angle sensing integrated spectrum (OASIS) by using the PQR laser diode.

Referring to FIG. 9, there is illustrated a geometry of the optical angle sensing integrated spectrum (OASIS) application by using the angle-dependent multiple wavelength radial emission in the 3D PQR laser diode as shown in FIG. 7.

Since the PQR laser emits continuous spectra of wavelengths $\lambda_1$ to $\lambda_6$, over about 30 nm tuning range, i.e., the lasing wavelength of the PQR laser diode depends on the slanted view angle, only a certain wavelength, e.g., $\lambda_4$, among the wavelengths $\lambda_1$ to $\lambda_6$ emitted is reflected by the target in accordance with the angle between the target and the PQR laser and, then, detected by an optical spectrum analyzer (OSA). Therefore, the angle of the target can be measured by detecting the wavelength admitted.

Alternatively, the target site itself may be responded by the detector so that a simple source-detection geometry can be used for the automation technology.

If the target is far from the PQR laser, a high density PQR laser array in which a plurality of PQR lasers are arranged with a predetermined pattern may be used.

While the present invention has been described with respect to certain preferred embodiments only, other modifications and variations may be made without departing from the spirit and scope of the present invention as set forth in the following claims.

What is claimed is:

1. A photonic quantum ring (PQR) laser diode with a plurality of laterally extending layers, one on top of another in the stack axis, comprising:

an active region sandwiched between an n type multi-layer distributed Bragg reflector (DBR) stack and a p type multi-layer DBR stack and having a rounded circumference, wherein, along the circumference of the active region, three dimensional PQR radiations are emitted with various wavelengths as a function of slanted view angle with respect to the stack axis;

a covering region for surrounding the active region and for transmitting the three dimensional PQR radiations therethrough, wherein the refractive index of the active region is larger than that of the covering region so that the three dimensional PQR radiations are confined by a three dimensional toroidal Rayleigh's cavity effectively formed along the circumference of the active region; and striped or segmented top electrodes which make the three dimensional PQR radiations from the three dimensional toroidal Rayleigh's cavity become visible and detectable.

2. The PQR laser diode as recited in claim 1, wherein the active region has one or more quantum wells.

3. The PQR laser diode as recited in claim 2, wherein the active region is made of a plurality of alternating layers of AlzGa1−zAs with a smaller bandgap energy and AlxGa1−xAs with a larger bandgap energy, where $0 \leq z$ and $x \geq 1$.

4. The PQR laser diode as recited in claim 3, wherein each two layers of the multi-layer p type and the multi-layer n type DBR stacks has one layer with a relative high index of refraction and the other layer with a relative low index of refraction, wherein said the other layer with said relative low index of refraction is adjacent to said active region.

5. The PQR laser diode as recited in claim 1, wherein the wavelength of the three dimensional PQR radiations depends on the slanted view angle relative to the stack axis and, thereby, on angle-dependent multiple-wavelength stimulated emissions over the predetermined tuning range being emitted.

6. The PQR laser diode as recited in claim 1, wherein the threshold current thereof satisfies a square law dependency on the diameter thereof and its order is in $\mu A$ range.

7. The PQR laser diode as recited in claim 1, wherein the active region is cylindrically shaped.

8. The PQR laser diode as recited in claim 7, wherein the active region is cylindrically etched by a chemically assisted ion beam etching.

* * * * *